United States Patent [19]
Klein

[11] 4,247,862
[45] Jan. 27, 1981

[54] IONIZATION RESISTANT MOS STRUCTURE

[75] Inventor: Raphael Klein, Los Altos, Calif.

[73] Assignee: Intel Corporation, Santa Clara, Calif.

[21] Appl. No.: 922,225

[22] Filed: Jul. 5, 1978

Related U.S. Application Data

[63] Continuation-in-part of Ser. No. 828,253, Aug. 26, 1977, abandoned.

[51] Int. Cl.$^3$ ............................................ H01L 27/04
[52] U.S. Cl. ...................................... 357/48; 357/41; 357/47; 357/90; 357/91
[58] Field of Search ........................ 357/41, 47, 48, 90, 357/91

[56] References Cited

U.S. PATENT DOCUMENTS 4,113,513  9/1978  de Brebisson .................... 357/91

Primary Examiner—Edward J. Wojciechowicz
Attorney, Agent, or Firm—Blakely, Sokoloff, Taylor & Zafman

[57] ABSTRACT

A structure and method for preventing minority carriers caused by an alpha particle, or the like, from drifting into storage regions and causing a false data bit. In a high density MOS circuit, a single alpha particle including one originating within the substrate or circuit package can generate enough carriers to give a false data bit. A minority carrier reflective barrier is employed to prevent substantial numbers of minority carriers from drifting into the active layer. In the presently preferred embodiment, this barrier is formed by ion implanting the upper surface of the substrate.

10 Claims, 5 Drawing Figures

IONIZATION RESISTANT MOS STRUCTURE

This is a continuation-in-part application of Ser. No. 828,253, filed Aug. 26, 1977, now abandoned.

BACKGROUND OF THE INVENTION

1. Field of the Invention

The invention relates to structures and methods for immunizing MOS integrated circuits to ionization, such as that caused by alpha particles.

2. Prior Art

High levels of radiation, including alpha particles, can be very damaging to semiconductors and integrated circuits. For example, radiation can damage layers in integrated circuits, permanently shifting threshold voltages and thereby destroying the effectiveness of the circuit. A great deal of research has been performed on "hardening" electrical circuit so that they will tolerate high levels of radiation. For the most part, these efforts have been directed towards preventing damage from high density and high energy radiation which is incident on a circuit; that is, radiation from an external source, not radiation from within the circuit itself.

There is a certain amount of radiation, including alpha particles, present in the atmosphere and in many common materials used in the fabrication of integrated circuits and their packages. In the past, this very low density radiation has not presented any problems for integrated circuits. However, as will be described in greater detail in conjunction with FIG. 1, even a single alpha particle can present a problem for a high density (small geometry) MOS integrated circuit.

SUMMARY OF THE INVENTION

A structure for preventing failures from ionization in an integrated circuit where a plurality of field-effect devices are formed on the upper surface of a semiconductor body. Non-uniform doping is employed within the body below the upper surface. This non-uniform doping provides an electric field which repels minority carriers so as to prevent them from entering the active devices of the integrated circuit.

DETAILED DESCRIPTION OF THE INVENTION

A structure and method is described which is particularly suited for metal-oxide-semiconductor (MOS) circuits for immunizing such circuits against ionization in the substrate. The electron-hole pairs caused by ionizing radiation, including alpha particles, etc., can provide failures in such circuits as will be described. In the following description, numerous specific details are given to provide a thorough understanding of the invention such as dopant concentration levels, specific conductivity types, etc. However, it will be obvious to one skilled in the art that the invention may be practiced without these specific details. Moreover, while the invention is described for an n-channel embodiment, it is equally applicable for p-channel circuits. In some instances, well-known structures and processes have not been set forth in detail in order not to obscure the invention in unnecessary detail.

Before describing the invention, its need will be discussed in conjunction with FIG. 1. Assume that an MOS integrated circuit is fabricated on the upper surface of substrate 10. A single gate 11 coupled to a line 12 of this circuit is shown. Assume further that the gate 11 is one of a plurality of gates associated with a dynamic RAM or a charge-coupled device (CCD) and that a binary one is represented by a bundle of charges whereas the binary zero is represented by little or no charge. CCD structure will be used here as an example. As data is shifted along the CCD, a positive voltage is selectively applied to gate 11 for an n-channel device. During the operation of such a device there will be times when a positive potential is applied to gate 11 with no charge (or little charge) stored under the gate. This will occur when gate 11 is shifting or storing a binary zero.

If an alpha particle shown by path 16 enters the silicon substrate 10, it will generate electron-hole pairs as it passes through the silicon. The electrons will tend to drift under the gate 11 if a positive voltage is applied to this gate. If the device has negative (for n-channel) back bias (externally or internally supplied), then the electrons will drift toward the gate even if the gate voltage is zero. More of those electrons closer to the gate will be collected under the gate and fewer of those further from the gate are attracted to the gate as is shown graphically by the collection zone 14. Thus, an incident alpha particle can cause electrons to gather under the gate 11.

With current high density MOS circuits, the difference between the two binary states is represented with as few as 800,000 electrons (or less). As densities increase is years to come, this difference will, no doubt, be represented with even fewer electrons.

Figure 1:
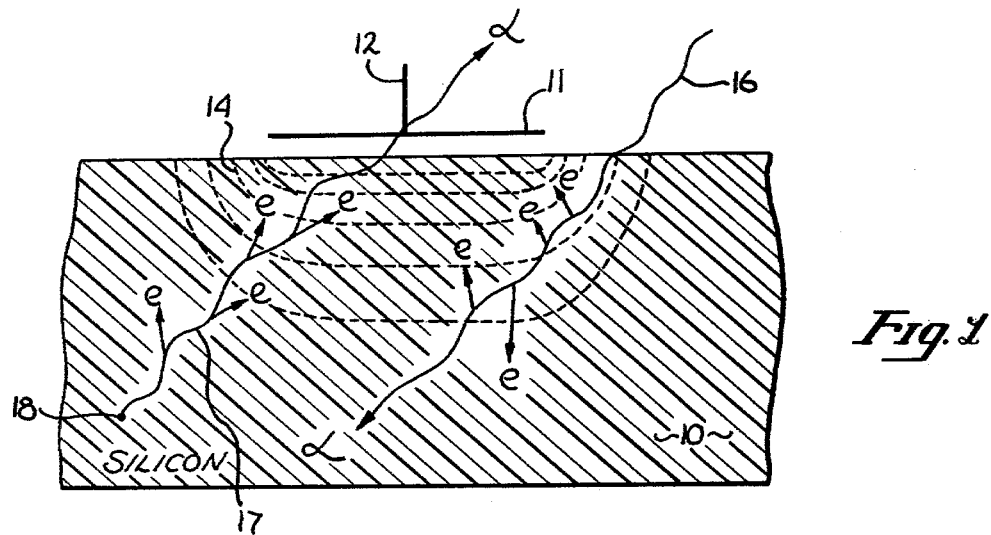
FIG. 1 is a cross-sectional elevation view of a silicon substrate. This view is used to illustrate the effects of an alpha particle as it passes through the substrate.

Assume that the alpha particle entering the substrate 10 of FIG. 1 has an energy of between 3 to 8 Mev (typically 5 Mev). This is consistent with numerous radioactive materials. The particle will lose this energy in the silicon at a rate of approximately 150 KV per micron and generate approximately 50,000 electron-hole pairs per micron. Thus, if the particle travels approximately 25 microns (crossing on its way the collection zone 14), 800,000 electrons could accumulate under the gate 11. This number of electrons, occurring when a binary zero is stored below gate 11, could change the binary zero to a binary one.

(With MOS circuit densities of the late 1960's and early 1970's approximately $3 \times 10^6$ electrons or holes distinguished one binary state from the other. Because of this large number, a single alpha particle would not likely generate enough electron-hole pairs to change one binary state to another.)

The generation of these electron-hole pairs in the substrate provides false data; these nonspecific failures are sometimes referred to as "soft" failures. They are particularly troublesome since they are similar to noise, and testing a circuit after a soft failure does not reveal the origin of the failure since no permenent detectable damage results from low incidence of alpha particles.

While in the above description a soft failure was described in conjunction with a CCD, such soft failures are equally applicable to dynamic random-access memories, bucket-brigade devices (BBD) and other integrated circuits; also, such failures can occur in analog circuits as well as digital circuits.

Soft failures due to ionizing radiation can be troublesome even with very low levels of "background" radiation. For example, even if the background radiation is one alpha particle per hour per square centimeter, a substantial number of soft failures will occur in a high density integrated circuit over long periods of time. Moreover, it is difficult to shield the integrated circuit from these particles since their origin may be from within the substrate or from the integrated circuit package. For example, traces of uranium and thorium are frequently present in numerous glasses employed with semiconductor products or for that matter in the silicon itself. As shown by the path 17 (FIG. 1), an alpha particle originating at point 18 within the substrate 10 can cause the same problem as one incident on the substrate. Also, any heavy ionized particle or other radiation which generates electron-hole pairs within the substrate can cause the problem described in conjunction with FIG. 1.

Figure 2:
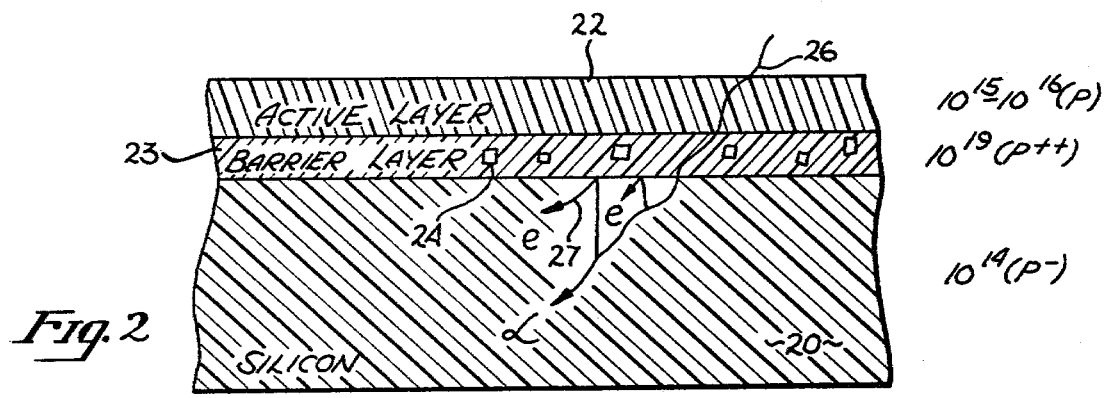
FIG. 2 is a cross-sectional elevation view of a substrate which includes a barrier layer for preventing minority carriers from drifting into an active layer.

Referring to FIG. 2, a silicon substrate 20 is illustrated which is doped to a level of $10^{14}$ atoms/cm$^3$ with a p-type dopant. An apitaxial layer 23 (barrier layer) which is heavily hoped ($10^{19}$ atom/cm$^3$) with the p-type dopant is formed on the upper surface of the substrate 20. (This heavy doping is shown with the symbol 24.) A second epitaxial layer 22 is formed on the upper surface of the barrier layer 23. This last layer 22 is identified as the active layer since the active MOS devices, that is, the integrated circuit, are formed on and within this layer. The dopant concentration in the active layer 22 is selected to suit the particular MOS process employed and is shown in FIG. 2 as $10^{15}$–$10^{16}$ atoms/cm$^3$. In this embodiment, the active layer 22 may be between 3 to 10 microns thick. In one embodiment, the buried barrier layer 23 is relatively thin, that is, approximately 1 micron thick; in another embodiment, the barrier layer 23 may be relatively thick, e.g., 10 microns or greater.

The barrier layer 23 prevents soft failures since it prevents the minority carriers from drifting into the active layer 22. This, in effect, reduces the volume of the collection zones (such as the collection zone 14 of FIG. 1). The electrons generated within the substrate 20 below the barrier layer 23 are reflected from the layer 23 as will be described in greater detail; this is shown by the electron paths 27. Those electrons generated within the barrier layer 23 are quickly recombined, as will be described in greater detail. Only those electrons freed in the active layer 22 are available to cause soft failures. However, since the layer 22 is relatively thin, a sufficient number of electrons are not available to cause soft failures, unless they are generated by shallow-angled alpha particles, where most of the path is inside the active layer.

The non-uniform doping between the substrate 20 and the layer 23 provides an inherent electric field which repels minority carriers away from layer 23, and hence away from the active layer 22. This non-uniform doping provides a barrier of approximately 180 mv, in a practical embodiment. If we assume that the thermal energy of the electrons is proportional to kT, where k is Boltzmann's constant and T is the temperature in degrees Kelvin, typical energies of approximately 26 mv can be expected. Thus, the barrier energy is several times greater than the minority carrier energy and very few carriers will penetrate the barrier.

Recombining of the minority carriers occurs with the heavily doped varrier layer 23 before these carriers enter the active layer 22. The diffusion length of the minority carriers decreases sharply at high concentrations of dopants. At very high concentrations, a strong dependence exists between the life-time term ($\tau$) and the concentration level. (See *Physics and Technology of Semiconductor Devices*, by Grove, published by Wiley & Son, 1967, page 124 for the definition of diffusion length). It is estimated that $\tau$ is equal to approximately 1 microsecond with concentraton levels of $2 \times 10^{18}$ atoms/cm$^3$ and that $\tau$ is approximately equal to 10 nanoseconds at concentration levels of $10^{19}$ atoms/cm$^3$. In practice, the diffusion length of minority carriers can be reduced to a few microns if the doping concentration level is very high (e.g., $10^{19}$ atoms/cm$^3$).

Figure 3:
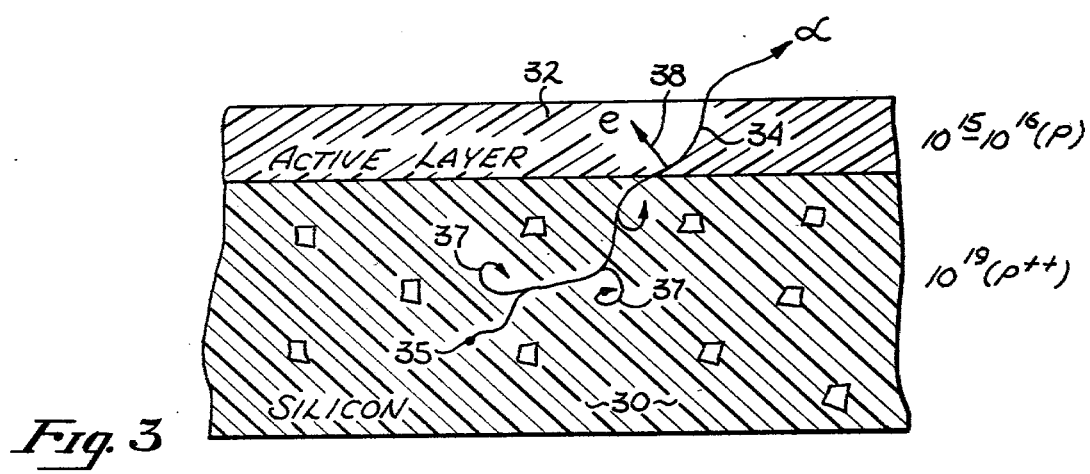
FIG. 3 is a cross-sectional elevation view of a substrate which includes a highly doped body used to cause quick recombination of minority carriers.

In FIG. 3, a structure is illustrated which employs recombination as a means of preventing the minority carriers from reaching the active layer 32. A heavily doped silicon substrate 30 ($10^{19}$ atoms/cm$^3$) is employed for this purpose. The active layer 32 is an epitaxial layer (2 to 5 microns thick) formed on the substrate 30.

An alpha particle path 34 originating within the silicon substrate 30 at point 35 is illustrated in FIG. 3. The minority carriers generated by this particle recombine quickly within the very heavily doped substrate as shown by the paths 37, thus most carriers do not reach the active layer 32. As the alpha particle passes through the active layer 32, those minority carriers generated within this layer such as shown by path 38 may reach an active device. However, since the collection volume is substantially reduced, soft failures are not probable. This structure has the disadvantage that the shallow incident alpha particles will generate electrons which may be reflected back into the active region.

Figure 4:
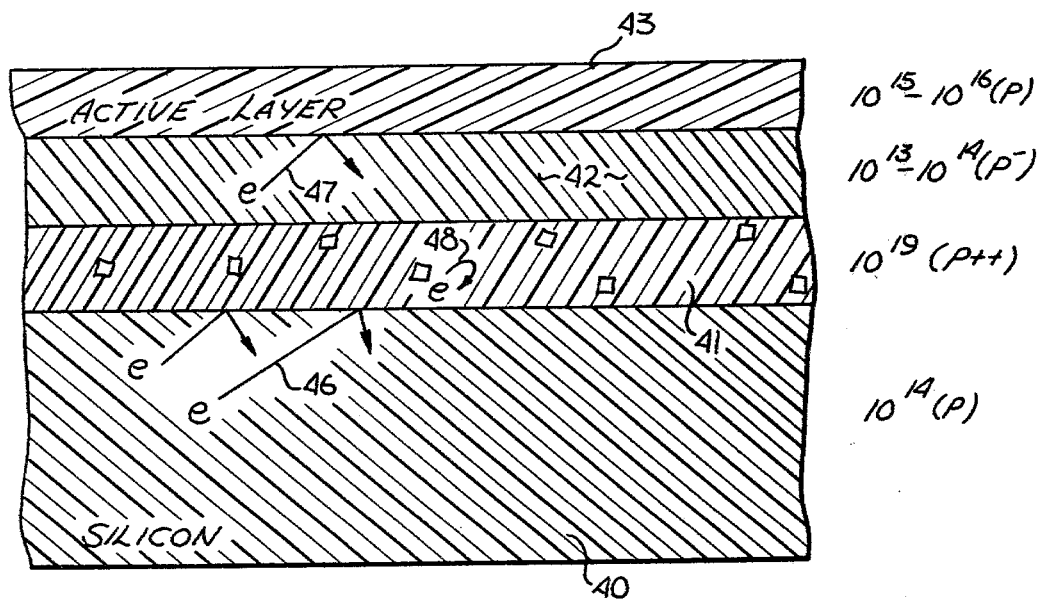
FIG. 4 is a cross-sectional elevation view of a multi-layer structure employed for preventing minority carriers from drifting into the active layer.

Another embodiment is illustrated in FIG. 4 wherein both recombination and reflection are relied upon to prevent these soft failures. In this embodiment a medium doped ($10^{14}$ atoms/cm$^3$) substrate 40 is employed. A first epitaxial layer 41 which is 2-10 microns thick and heavily doped ($10^{19}$ atoms/cm$^3$) is formed on the upper surface of the substrate 40. A lightly doped ($10^{13}$–$10^{14}$ atoms/cm$^3$) epitaxial layer 42 which is approximately 5 microns thick is formed on layer 41. The active layer 43 on which the active devices are formed is grown on the upper surface of the layer 42. This layer is 3–5 microns thick and doped to a level of $10^{15}$$10^{16}$ atoms/cm$^3$ in the presently preferred embodiment. Those minority carriers generated within the silicon substrate 40 are reflected because of the dopant concentration gradient between the substrate 40 and layer 41. This is shown graphically by the path 46. Those carriers generated within the layer 41 are recombined as indicated by the path 48. The minority carriers generated within the layer 42 are reflected from the layer 43 as indicated by path 47 because of the dopant concentration gradient between layers 42 and 43. Because of the lightly doped layer 42, which separates the active layer 43 from the heavily doped layer 41, this embodiment provides good capacitance characteristics for the devices on the active layer 43.

Figure 5:
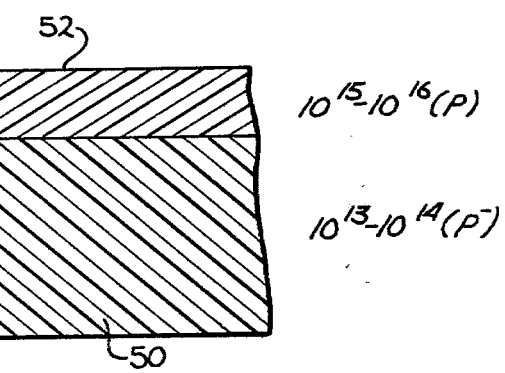
FIG. 5 is a cross-sectional elevation view of a substrate illustrating the presently preferred embodiment of a reflective barrier formed by ion implantation.

FIG. 5 illustrates the presently preferred embodiment of the present invention. In this embodiment, reflection is relied upon to prevent the minority carriers from entering the active layer 52. This active layer is formed by ion implanting the substrate 50. A boron implantation which is driven during subsequent processing to a depth of approximately 2 microns is used. A lightly doped ($10^{13}$–$10^{15}$ atoms/cm$^3$) substrate 50 is employed; the active layer 52 is doped to a level of $10^{15}$–$10^{17}$ atoms/cm$^3$. As indicated by path 53, reflection is provided by the interface between the active layer 52 and the substrate 50 due to the dopant gradient. This presently preferred embodiment has the advantage of being easy to form since no epitaxial layers are required.

While in the above description the various layers employed for preventing the minority carriers from reaching the active layer have been described as epitaxial layers, it will be obvious to one skilled in the art that these layers may be formed in other ways. For example, these layers may be formed with diffusion steps or through the use of ion implantation and appropriate drive-in steps.

Thus, a method and structure has been described which prevents soft failures resulting from ionization in the substrate of MOS circuits. In some embodiments, reflection of the minority carriers is relied upon to prevent these carriers from entering the storage areas. In other embodiments, recombination is relied upon to prevent the minority carriers from entering the storage areas of the active devices.

I claim:

1. In an MOS integrated circuit where a plurality of field-effect devices are formed on the upper surface of a semiconductor body, a structure for preventing failures from ionization within said body comprising:

nonuniform doping within the upper regions of said body below said upper surface, said nonuniform doping providing a gradient with a lower dopant concentration towards the interior of said body and a higher dopant concentration towards said upper surface, such that an electric field is established which repels minority carriers generated in said body so as to prevent them from entering said upper surface, whereby minority carriers will not drift into the active circuit devices.

2. The structure defined by claim 1 wherein said nonuniform doping is formed by ion implanting said body.

3. The structure defined by claim 2 wherein said body is a p-type body and wherein boron is used for said ion implanting.

4. The structure defined by claim 1 wherein said nonuniform doping is formed by a heavily doped epitaxial layer formed on a substrate.

5. The structure defined by claim 4 including a second epitaxial layer formed on said heavily doped layer for receiving said active circuit devices.

6. In the fabrication of an MOS integrated circuit on the surface of a silicon substrate, a process for preparing said substrate for receiving said integrated circuit, such that said circuit is substantially immune to failures which result from ionization within said substrate thereby allowing minority carriers to drift into said circuit causing said failures, comprising the step of:

ion implanting said surface of said substrate so as to form a dopant gradient in the upper regions of said substrate which varies from a lower dopant concentration towards the interior said substrate to a higher dopant concentration in the direction of said surface, whereby said dopant gradient provides an electrical field which repels said minority carriers so as to prevent them from interfering with said circuit.

7. The process defined by claim 6 wherein said substrate is ion implanted to a depth of approximately two microns.

8. The process defined by claim 7 wherein said ion implantation employs a boron impurity.

9. The process defined by claim 6 wherein said substrate is a p-type substrate with an impurity level of between $10^{13}$ and $10^{15}$ atoms/cm$^3$.

10. The process defined by claim 6 wherein said ion implantation provides an impurity level of between $10^{15}$ and $10^{17}$ atoms/cm$^3$.

* * * * *

UNITED STATES PATENT AND TRADEMARK OFFICE
CERTIFICATE OF CORRECTION

PATENT NO. : 4,247,862
DATED : January 27, 1981
INVENTOR(S) : RAPHAEL KLEIN and TIMOTHY C. MAY It is certified that error appears in the above—identified patent and that said Letters Patent is hereby corrected as shown below:

The inventors of the patent should be:

RAPHAEL KLEIN and TIMOTHY C. MAY

Column 3,

Line 33: "hoped" should be --doped--

Line 33: "$10^{19}$atom" should be --$10^{19}$atoms--

Column 4,

Line 9: "varrier" should be --barrier--

Line 54: "$10^{15}$14 $10^{16}$" should be --$10^{15}$-$10^{16}$--

Signed and Sealed this

Third Day of November 1981

[SEAL]

Attest:

GERALD J. MOSSINGHOFF

Attesting Officer    Commissioner of Patents and Trademarks

REEXAMINATION CERTIFICATE (2753th)
United States Patent [19]
Klein et al.

[11] B1 4,247,862
[45] Certificate Issued Dec. 26, 1995

[54] IONIZATION RESISTANT MOS STRUCTURE

[75] Inventors: Raphael Klein, Los Altos; Timothy C. May, Sunnyvale, both of Calif.

[73] Assignee: Intel Corporation, Santa Clara, Calif.

Reexamination Request:
No. 90/003,702, Jan. 27, 1995

Reexamination Certificate for:
Patent No.: 4,247,862
Issued: Jan. 27, 1981
Appl. No.: 922,225
Filed: Jul. 5, 1978

Certificate of Correction issued Nov. 3, 1981.

Related U.S. Application Data

[63] Continuation-in-part of Ser. No. 828,253, Aug. 26, 1977, abandoned.

[51] Int. Cl.$^6$ .................. H01L 27/108; H01L 21/265
[52] U.S. Cl. .................. 257/297; 257/215; 257/549; 257/657; 257/660; 257/921; 437/48; 437/52; 437/74
[58] Field of Search .................. 257/369, 297, 257/215, 549, 657, 660, 921; 437/48, 52, 74

[56] References Cited

U.S. PATENT DOCUMENTS

| | | |
|---|---|---|
| 3,196,058 | 7/1965 | Webster, Jr. . |
| 3,418,226 | 12/1968 | Marinace . |
| 3,458,779 | 7/1969 | Blank et al. . |
| 3,462,311 | 8/1969 | Ross . |
| 3,465,209 | 9/1969 | Denning et al. . |
| 3,502,515 | 3/1970 | McMullen et al. . |
| 3,513,040 | 5/1970 | Kaye et al. . |
| 3,524,115 | 8/1970 | Herlet . |
| 3,570,112 | 3/1971 | Barry et al. . |
| 3,591,430 | 7/1971 | Schlegel . |
| 3,609,478 | 9/1971 | King et al. . |
| 3,614,558 | 10/1971 | Le Can et al. . |
| 3,615,938 | 10/1971 | Tsai . |
| 3,620,837 | 11/1971 | Leff et al. . |
| 3,620,851 | 11/1971 | King et al. . |
| 3,625,781 | 12/1971 | Joshi et al. . |
| 3,700,497 | 10/1972 | Epifano et al. . |
| 3,718,502 | 2/1973 | Gibbons . |
| 3,721,838 | 3/1973 | Brickman et al. . |
| 3,751,722 | 8/1973 | Richman . |
| 3,753,802 | 8/1973 | Tummers . |
| 3,759,763 | 9/1973 | Wang . |
| 3,766,637 | 10/1973 | Norris et al. . |
| 3,799,813 | 3/1974 | Danchenko . |
| 3,821,781 | 6/1974 | Chang et al. . |
| 3,860,454 | 1/1975 | DeWitt et al. . |
| 3,860,956 | 1/1975 | Kubo et al. . |
| 3,864,724 | 2/1975 | Kubo et al. . |

(List continued on next page.)

FOREIGN PATENT DOCUMENTS

| | | |
|---|---|---|
| 2750395 | 11/1977 | Germany . |
| 7401939 | 12/1973 | Netherlands . |

OTHER PUBLICATIONS

Fano, U., *Penetration of Protons, Alpha Particles, and Mesons*, Studies in Penetration of Charged Particles in Matter, National Academy of Sciences—National Research Council, Publ. 1133 (Nuclear Science Series—Report No. 39) 1964, pp. 287–352.

(List continued on next page.)

*Primary Examiner*—Edward Wojciechowicz

[57] ABSTRACT

A structure and method for preventing minority carriers caused by an alpha particle, or the like, from drifting into storage regions and causing a false data bit. In a high density MOS circuit, a single alpha particle including one originating within the substrate or circuit package can generate enough carriers to give a false data bit. A minority carrier reflective barrier is employed to prevent substantial numbers of minority carriers from drifting into the active layer. In the presently preferred embodiment, this barrier is formed by ion implanting the upper surface of the substrate.

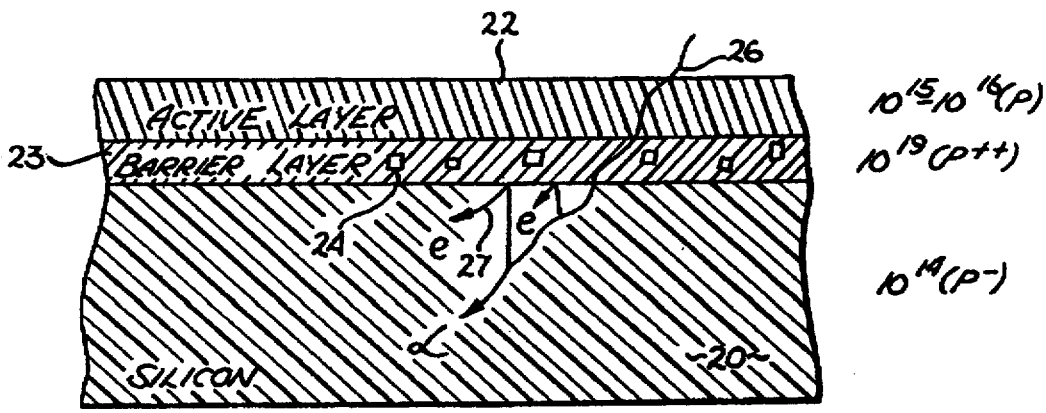

U.S. PATENT DOCUMENTS

| | | |
|---|---|---|
| 3,868,274 | 2/1975 | Hubar et al. |
| 3,876,472 | 4/1975 | Polinsky ........................ 257/369 |
| 3,898,107 | 8/1975 | Polinsky . |
| 3,905,836 | 9/1975 | Epple . |
| 3,917,491 | 11/1975 | Oswald, Jr. et al. |
| 3,946,419 | 3/1976 | DeWitt et al. |
| 3,961,355 | 6/1976 | Abbas et al. |
| 3,961,999 | 6/1976 | Antipov . |
| 3,964,089 | 6/1976 | Poon et al. |
| 3,984,822 | 10/1976 | Simko et al. |
| 4,001,050 | 1/1977 | Koo . |
| 4,001,872 | 1/1977 | Khajezadeh . |
| 4,001,878 | 1/1977 | Weimer . |
| 4,004,950 | 1/1977 | Baruch et al. |
| 4,013,484 | 3/1977 | Boleky et al. |
| 4,013,489 | 3/1977 | Oldham . |
| 4,017,887 | 4/1977 | Davies et al. |
| 4,027,380 | 6/1977 | Deal et al. |
| 4,038,680 | 7/1977 | Yagi et al. |
| 4,053,925 | 10/1977 | Burr et al. |
| 4,055,884 | 11/1977 | Jambotkar . |
| 4,110,125 | 8/1978 | Beyer . |
| 4,110,777 | 8/1978 | Esser et al. |
| 4,113,513 | 9/1978 | deBrebisson . |
| 4,123,564 | 9/1978 | Ajima et al. |
| 4,125,933 | 9/1978 | Baldwin et al. |
| 4,133,045 | 1/1979 | Littwin . |
| 4,141,027 | 2/1979 | Baldwin et al. |
| 4,164,751 | 12/1979 | Tasch, Jr. |
| 4,178,674 | 12/1979 | Liu et al. |
| 4,266,233 | 5/1981 | Bertotti et al. |
| 4,266,234 | 5/1981 | Hornbeck et al. |
| 4,280,272 | 7/1981 | Egawa et al. |
| 4,282,647 | 8/1981 | Richman . |
| 4,290,186 | 9/1981 | Klein et al. |
| 4,313,768 | 2/1982 | Sanders et al. |
| 4,326,211 | 4/1982 | Smeets . |
| 4,326,212 | 4/1982 | Bergeron et al. |
| 4,326,213 | 4/1982 | Shirai et al. |
| 4,413,401 | 11/1983 | Klein et al. |

OTHER PUBLICATIONS

R. B. Leighton, *Principles of Modern Physics: Chpt. 14—Particle Scattering*, pp. 485–511.
D. Binder et al., *Satellite Anomalies from Galactic Cosmic Rays, IEEE Transactions on Nuclear Science Annual Conference on Nuclear and Space Radiation Effects*, vol. NS–22, 7, pp. 2675–2680 (Dec. 1975).
J. Torkel Wallmark, *Basic Considerations of Microelectronics*, Chpt. 2, *Microelectronics: Theory, Design & Fabrication*, pp. 10 and 23–32, (1963).
Robert L. Fleischer et al., *Nuclear Tracks in Solids—Principles and Applications*, 1975, pp. 435–440, 457–459, 509–514, 541–545.
Adams, et al., *Thorium, Uranium, and Zirconium Concentrations in Bauxite, Economic Geology*, vol. 55, 1960, pp. 1653–1675.
Woodford, A. O., *Adventures in Earth History: Chpt 15—Radiometric Ages*, 1970, pp. 155–171.
C. Michael [000c]ederer et al., *Table of Isotopes (6th Edition)*, 1967, pp. 142 and 431–432.
Oliphant, Jim, *Memory System Design with the Intel® 2107B 4K RAM*, Intel Corporation, pp. 4–i to 4–26.
Oliphant, Jim, *Designing with Intel's Static M[000f]S RAMs*, Intel Corporation, pp. 6–i to 6–17 and PSG–1.
Dennard, et al., *Design of Ion–implanted MOSFETs with Very Small Physical Dimensions, IEEE Journal of Solid–State Circuits*, vol. SC–9, 5, pp. 256–268 (Oct. 1974).
Douglas, et al., *Surface Doping Using Ion–implantation for Optimum Guard Layer Design in COS/MOS Structures, IEEE Trans. on Electron Devices*, vol. ED–22, 10, pp. 849–856 (Oct. 1975).
Green, Martin A., *Resistivity Dependence of Silicon Solar Cell Efficiency and its enhancement using a heavily doped back contact region, IEEE Trans. on Electron Devices*, vol. ED–23, 1, pp. 11–16 (Jan. 1976).
Hauser, et al., *Minority Carrier Reflecting Properties of Semiconductor High–Low Junctions, Solid–State Electronics*, vol. 18, No. 18, pp. 715–716 (Sep. 1974).
Horiuchi, *Threshold Voltage Shift of N–Channel Si-gate MOSFETs, IEEE Trans. on Electron Devices*, vol. ED–22, 11, pp. 1038–1043 (Nov. 1975).
Grove, A. S., *Physics and Technology of Semiconductor Devices*, John Wiley and Sons, Inc., 1967, pp. 106–107.
Kamata, et al., *Substrate Current Due to Impact Ionization in MOS-FET, Japanese Journal of Applied Physics*, vol. 15, 6, pp. 1127–1133 (Jun. 1976).
McGreivy, Denis J., *On the Origin of Leakage Currents in Silicon–on–Sapphire MOS, IEEE Trans. on Electron Devices*, vol. ED–24, 6, pp. 730–738 (1975).
Sodini, et al., *Enhanced Capacitor for One–Transistor–Memory–Cell, IEEE Trans. on Electron Devices*, vol. ED–23, pp. 1187–1189 (1976).
Tasch, et al., *The Charge–Coupled RAM cell concept*, Presented at the 6th Semiconductor Interface Specialist Conference, San Juan, Puerto Rico, Dec. 4–6, pp. 126–131 (1975).
Yamada, et al., *Soft Error Improvement of Dynamic RAM with Hi–C Structure, Mitsubishi Electric Corp.*, pp. 578–581 (1980).
Wang et al., *Threshold Voltage Characteristics of Double–Boron Implanted Enhancement–mode MOSFETs, IBM J. Res. Devel.*, pp. 530–538 (Nov. 1975).
Yuan, et al., *High Performance Radiation Hard CMOS/SOS Technology, IEEE Trans. on Nuclear Science*, vol. NS–24, 6, pp. 2199–2204 (Dec. 1977).
Dill, H. G. et al., *A New MNOS Charge Storage Effect, IEEE Journal of Solid–State Electronics*, vol. 12, pp. 981–987 (1969).
Gosney, W. Milton, *Subthreshold Drain Leakage Currents in MOS Field–Effect Transistors', Electron Devices*, vol. ED–19, Feb. 1972, pp. 213–219.
Swanson, et al., *Ion–Implanted Complementary MOS Transistors in Low–Voltage Circuits, IEEE Journal of Solid–State Circuits*, vol. SC–7, 2, pp. 146–153 (Apr. 1972).
Boleky et al., *High–Performance Low–Power CMOS Memories using Silicon–on–Sapphire Technology, IEEE Journal of Solid–State Circuits*, vol. SC–7, No. 2, pp. 135–155 (Apr. 1972).
McLintock et al., *Effects of Process Changes on Double–Diffused MOST Characters*, Carlston Univ., Ottawa, Canada, pp. 367–369.
*Reducing Detrimental Minority Carrier Effects in Semiconductor Devices, IBM Technical Disclosure Bulletin*, pp. 2707–2708, Feb. 1973.
Gosney et al., *The Extension of Self–Registered Gate and Doped–Oxide Diffusion Technology to the Fabrication of Complementary MOS Transistors, IEEE Transactions on Elec. Devices*, vol. ED–20, 5, pp. 469–472 (May 1973).
Dennard et al., *Ion Implanted MOSFETs with Very Short Channel Lengths, IBM Thomas J. Watson Research Ctr.*, pp. 152–155.

Antcliffe, G. A. et al., *Operation of CCDs with Stationary and Moving Electron–Beam Input*, IEEE Transactions on Elec. Devices, vol. ED–22, 10, p. 857.

Carnes et al., *Drift–Aiding Fringing Fields in Charge–Coupled Devices*, IEEE Journal of Solid–State Circuits, pp. 322–326 (Oct. 1971).

Pashley et al., *H–MOS scales traditional devices to higher performance level*, Electronics, pp. 94–99 (Aug. 18, 1977).

Borkan, H., *Radiation Hardening of CMOS Technologies—An Overview*, IEEE Trans. on Nuclear Science, vol. NS–24, 6, pp. 2043–2046 (Dec. 1977).

Sanders, T. J., *CMOS Hardness Assurance Through Process Controls and Optomized Design Procedure*, IEEE Trans. on Nuclear Science, vol. NS–24, 6, pp. 2051–2055 (Dec. 1977).

London, et al., *Establishment of a Radiation Hardened CMOS Manufacturing Process*, IEEE Trans. on Nuclear Science, vol. NS–24, 6, pp. 2056–2059 (Dec. 1977).

Smyth, Jr. et al., *Parameter Sensitivities for Hardness Assurance: Displacement Effects in Bipolar Transistors'*, IEEE Transactions on Nuclear Science, vol. NS–24, 6, pp. 2093–2096 (Dec. 1977).

Adams et al., *A Radiation Hardened Field Oxide*, IEEE Transactions on Nuclear Science, vol. NS–24, 6, pp. 2099–2101 (Dec. 1977).

Cricchi et al., *Radiation Hardened CMNOS/SOS Mask Programmable ROM and General Processor Unit*, IEEE Transactions on Nuclear Science, vol. NS–24, 6, pp. 2236–2243 (Dec. 1977).

May et al., *A New Physical Mechanism for Soft Errors in Dynamic Memories*, Intel Corporation, pp. 33–40.

Pickel et al., *Cosmic Ray Induced Errors in MOS Memory Cells*, IEEE Trans. on Nuclear Science, vol. NS–25, 6, pp. 1166–1171 (Dec. 1978).

Meieran et al., *Measurement of Alpha Particle Radioactivity in IC Device Packages*, IEEE, pp. 13–22, 1979.

Huang et al., *Component/System Correlation of Alpha Induced Dynamic RAM Soft Failure Rates*, IEEE, pp. 23–29, 1979.

Schindlbeck, G., *Analysis of Dynamic RAMs by Use of Alpha Irradiation*, IEEE, pp. 30–34, 1979.

May et al., *Alpha–Particle–Induced Soft Errors in Dynamic Memories*, IEEE Trans. on Elec. Devices, vol. ED–26, pp. 2–9 (Jan. 1979).

May, T. C., *Soft Errors in VLSI–Present and Future*, IEEE—29th Electronic Components Conf., pp. 247–256 (May 14–16, 1979).

Capece, R. P., *Alphas Stymie Statics—Research in Soft–Error Phenomena Reveals New Alpha Particle Mechanisms and Indicates Certain Static Designs may be Susceptible*, Electronics, pp. 85–86 (Mar. 15, 1979).

REEXAMINATION CERTIFICATE ISSUED UNDER 35 U.S.C. 307

NO AMENDMENTS HAVE BEEN MADE TO THE PATENT.

AS A RESULT OF REEXAMINATION, IT HAS BEEN DETERMINED THAT:

The patentability of claims 1-10 is confirmed.

* * * * *